(12) United States Patent
Usuda et al.

(10) Patent No.: US 8,766,236 B2
(45) Date of Patent: Jul. 1, 2014

(54) SEMICONDUCTOR DEVICE AND METHOD OF MANUFACTURING THE SAME

(75) Inventors: Koji Usuda, Yokohama (JP); Tsutomu Tezuka, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/236,182

(22) Filed: Sep. 19, 2011

(65) Prior Publication Data

US 2012/0168830 A1 Jul. 5, 2012

(30) Foreign Application Priority Data

Jan. 5, 2011 (JP) ................. 2011-000812

(51) Int. Cl.
*H01L 29/06* (2006.01)
(52) U.S. Cl.
USPC .............. 257/18; 257/55; 257/63; 257/377; 257/384; 257/754; 257/755; 257/E31.035; 257/E31.046; 257/E21.207; 438/300
(58) Field of Classification Search
None
See application file for complete search history.

(56) References Cited

U.S. PATENT DOCUMENTS

| 7,053,400 | B2 | 5/2006 | Sun et al. | |
|---|---|---|---|---|
| 7,829,421 | B2 | 11/2010 | Wei et al. | |
| 8,017,979 | B2 | 9/2011 | Usuda et al. | |
| 2003/0227036 | A1* | 12/2003 | Sugiyama et al. | 257/288 |
| 2006/0009001 | A1 | 1/2006 | Huang et al. | |
| 2009/0256178 | A1* | 10/2009 | Matsuo et al. | 257/288 |
| 2010/0072549 | A1 | 3/2010 | Usuda et al. | |

FOREIGN PATENT DOCUMENTS

| CN | 1950946 A | 4/2007 |
|---|---|---|
| CN | 101432859 A | 5/2009 |
| JP | 2001-57429 | 2/2001 |
| JP | 2005-72056 | 3/2005 |
| JP | 2008-515188 | 5/2008 |
| JP | 2010-80487 | 4/2010 |
| WO | WO 2006/039038 A2 | 4/2006 |

OTHER PUBLICATIONS

Tezuka et al.; "Novel Fully-Depleted SiGe-on-Insulator pMOSFETs With High-Mobility SiGe Surface Channels", IEDM Tech. Dig. 946, pp. 33.6.1-33.6.3, (2001).

(Continued)

*Primary Examiner* — Steven Loke
*Assistant Examiner* — Cuong B Nguyen
(74) *Attorney, Agent, or Firm* — Finnegan, Henderson, Farabow, Garrett & Dunner, L.L.P.

(57) ABSTRACT

A semiconductor device according to an embodiment includes: a substrate; a first semiconductor layer formed on the substrate and having a strain; a second and a third semiconductor layers formed at a distance from each other on the first semiconductor layer, and having a different lattice constant from a lattice constant of the first semiconductor layer; a gate insulating film formed on a first portion of the first semiconductor layer, the first portion being located between the second semiconductor layer and the third semiconductor layer; and a gate electrode formed on the gate insulating film. At least one of outer surface regions of the second semiconductor layer and a second portion of the first semiconductor layer is a first silicide region, and at least one of outer surface regions of the third semiconductor layer and a third portion of the first semiconductor layer is a second silicide region, the second and third portions being located immediately below the second and third semiconductor layers respectively.

6 Claims, 9 Drawing Sheets

(56) References Cited

OTHER PUBLICATIONS

Usuda et al.; "Observation of Strain Retention by Effect of Stress-Retainer on Source/Drain Regions of SSOI Islands with High-Lateral-Resolution UV Raman Measurement", Abstract for $5^{th}$ International SiGe Technology and Device Meeting, pp. 1-2, (2010).
Notification of Reason for Rejection issued by the Japanese Patent Office on Nov. 13, 2012, for Japanese Patent Application No. 2011-000812, and English-language translation thereof.
Notification of Reason for Rejection issued by the Japanese Patent Office on Jun. 14, 2013, for Japanese Patent Application No. 2011-000812, and English-language translation thereof.
Notice of Preliminary Rejection issued by the Korean Intellectual Property Office on Feb. 19, 2013, for Korean Patent Application No. 10-2011-117356, and English-language translation thereof.
Office Action issued by the Taiwanese Intellectual Property Office on Oct. 24, 2013, for Taiwanese Patent Application No. 100133692, and English-language translation thereof.
Notification of the First Office Action, issued by State Intellectual Property Office of the People's Republic of China, dated Jan. 24, 2014, in Chinese patent application No. 201110362688.4 (24 pages including translation).

* cited by examiner

A-A SECTION

B-B SECTION

| MATERIAL | THERMAL EXPANSION COEFFICIENT |
|---|---|
| Si | $4.2 \times 10^{-6}$ /°C |
| Ge | $6.1 \times 10^{-6}$ /°C |
| NiSi | $35 \times 10^{-6}$ /°C |
| NiSi$_{0.95}$Ge$_{0.05}$ | $34 \times 10^{-6}$ /°C |
| NiSi$_{0.85}$Ge$_{0.15}$ | $33 \times 10^{-6}$ /°C |
| NiSi$_{0.7}$Ge$_{0.3}$ | $25 \times 10^{-6}$ /°C |
| NiSi$_{0.5}$Ge$_{0.5}$ | $41 \times 10^{-6}$ /°C |
| NiSi$_{0.3}$Ge$_{0.7}$ | $41 \times 10^{-6}$ /°C |
| NiGe | $38 \times 10^{-6}$ /°C |

SEMICONDUCTOR DEVICE AND METHOD OF MANUFACTURING THE SAME

CROSS-REFERENCE TO RELATED APPLICATION

This application is based upon and claims the benefit of priority from prior Japanese Patent Application No. 2011-812 filed on Jan. 5, 2011 in Japan, the entire contents of which are incorporated herein by reference.

FIELD

Embodiments described herein relate generally to a semiconductor device including a strained semiconductor layer, and a method of manufacturing the semiconductor device.

BACKGROUND

Si-LSI semiconductor devices, particularly Si-MOSFETs, are becoming more and more sophisticated year after year, as the LSI technology is advancing. In recent years, however, the limits of the lithography technology have been pointed out from the viewpoint of the process technology, while the limits of carrier mobility have been pointed out from the viewpoint of device physics. In this trend, it is becoming more difficult to manufacture more sophisticated Si-LSI semiconductor devices.

Recently, attention has been paid to a method of applying a "strain" to the active layer to form a device, as a method for improving electron mobility, which is one of the indicators of improvements in performance of Si-MOSFETs. When a strain is applied to the active layer, the band structure of the active layer changes, and carrier scattering in the channel is restrained. Accordingly, the mobility of the carriers (electrons and holes) is enhanced. Specifically, a mixed crystal layer made of a material having a larger lattice constant than that of Si, or a strain-relaxed SiGe mixed crystal layer (hereinafter referred to simply as the SiGe layer) having a Ge concentration of 20%, for example, is formed on a Si substrate, and a Si layer is formed on the SiGe layer. The strain derived from the difference in lattice constant is applied to the Si layer, and the Si layer turned into a strained Si layer. It was reported that, when such a strained Si layer was used as the channel, the electron mobility was greatly enhanced and became approximately 1.76 times higher than that in a case where a non-strained Si layer was used as the channel.

Also, as a method of forming a strained Si layer on a Semiconductor On Insulator (SOI) structure, there has been a known method by which a strained Si layer is formed on a SiGe layer formed on a buried oxide (BOX) layer on a Si substrate. In such a structure, the short channel effect (SCE) of the MOSFET is restrained, and a sophisticated semiconductor device is realized.

To realize even more sophisticated semiconductor devices along with further miniaturization, a more advanced strain control technique is essential.

In the "hp45-generation" and later however, semiconductor devices that become smaller in size along with the improvement in device performance and have a high probability that the above described strained semiconductor device is used therein, the gate length Lg in the carrier moving direction in the channel is considered to be 50 nm or smaller. In such a case, the size of the so-called active layer to form the source/drain regions and the gate region in the formation of a device becomes even smaller along with an increase in integration degree. This active layer is formed by cutting out a mesa from the above described globally-strained substrate. Therefore, the strain in the active layer might be relaxed, depending on the pattern size, shape, thickness, substrate dependence, or the like, and systematic consideration should be required.

Strain relaxation occurs mainly due to formation of a free edge at the strained layer that causes strain relaxation. It has become apparent that, in a strained layer that is smaller than several hundreds of nanometers, over which relaxation from the free end can reach, the relaxation becomes significant. Therefore, as described above, to form a strained device on the order of submicron meters in the next- and later-generation devices, it is inevitable to use a control technique for restraining strain relaxation. To effectively use a strained channel in a latest MOSFET, it is critical how to control the strain in the active layer. In view of this, a semiconductor device having strain control layers formed in a strained semiconductor layer beforehand has been suggested to restrain strain relaxation.

Meanwhile, device miniaturization is showing no sign of slowing down, and further miniaturization is being pursued. The source/drain regions at both ends of the gate structure are becoming smaller and smaller along with the miniaturization. Therefore, it is inevitable that the above mentioned strain control layers also become smaller and smaller. To maintain the strain in the channel while coping with the reduction in device size, an increase in the thickness of each strain control layer is realistic.

However, if control layers having excess thicknesses are formed, a high resistance is generated in the source/drain, and the high resistance would not only cancel the improvement in device characteristics made by the strain application but cause many negative factors such as variations among device operations. Therefore, there is a need to take some measures against those negative factors.

DETAILED DESCRIPTION

A semiconductor device according to an embodiment includes: a substrate; a first semiconductor layer formed on the substrate and having a strain; a second and a third semiconductor layers formed at a distance from each other on the first semiconductor layer, and having a different lattice constant from a lattice constant of the first semiconductor layer; a gate insulating film formed on a first portion of the first semiconductor layer, the first portion being located between the second semiconductor layer and the third semiconductor layer; and a gate electrode formed on the gate insulating film. At least one of an outer surface region of the second semiconductor layer and an outer surface region of a second portion of the first semiconductor layer is a first silicide region, the second portion being located immediately below the second semiconductor layer, and at least one of an outer surface region of the third semiconductor layer and an outer surface region of a third portion of the first semiconductor layer is a second silicide region, the third portion being located immediately below the third semiconductor layer.

Before describing the embodiments, the course of events for achieving the present invention will be described below.

Figure 1:
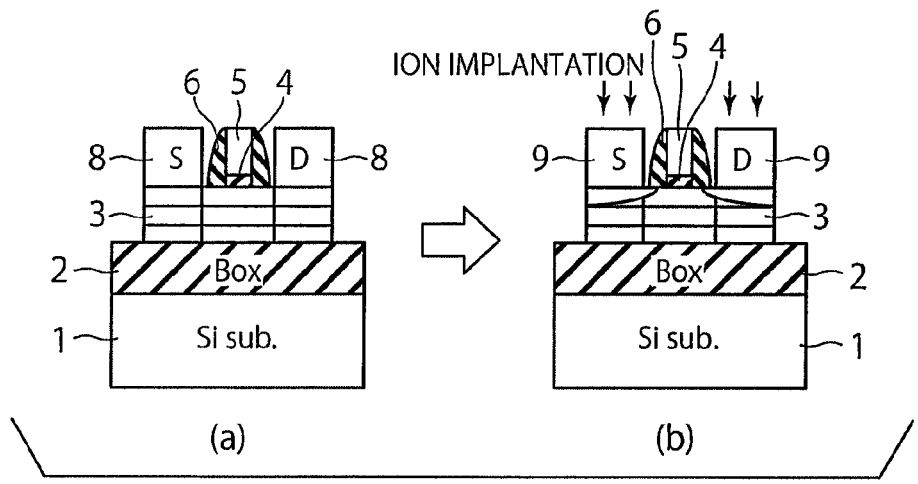
FIGS. 1(a) and 1(b) are cross-sectional views showing the structure of a strained structure.

FIGS. 1(a) and 1(b) are schematic views illustrating a method of forming source/drain regions in a strained device having strain control layers. As shown in FIG. 1(a), in this strained device, a buried oxide layer (a BOX layer) 2 is formed on a Si substrate 1, and a strained semiconductor layer 3 is formed in a mesa-like shape on the buried oxide layer 2. A gate insulating film 4 is formed on the strained semiconductor layer 3, and a gate electrode 5 made of polysilicon, for example, is formed on the gate insulating film 4. Gate sidewalls 6 made of an insulating material are formed on the sides of the gate electrode 5. Strain control layers 8 to be the source/drain regions to control the strained semiconductor layer 3 to maintain the strain are formed on the portions of the strained semiconductor layer 3 located on both sides of the gate electrode 5. After the formation of the strain control layers 8, impurity ions are implanted in a self-aligning manner, with the gate electrode 5 and the gate sidewalls 6 serving as a mask. As a result, high-concentration impurity layers are formed in the strain control layers 8 and part of the semiconductor layer 3, and turn into source/drain regions 9. At this point, impurity ions are also implanted into the gate electrode 5.

Figure 2:
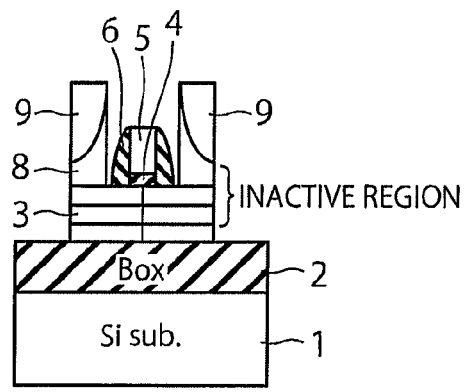
FIG. 2 is a cross-sectional view for explaining the problems with a miniaturized strained device.

Here, the inventors intend to experimentally manufacture a 60-nm- or later-generation MOSFET that has a gate length of 50 nm or less and a device size of 500 nm or less. In this case, the width of the gate region calculated by taking into account the physical length of the gate, the sizes of the gate sidewalls, the lithography variation, and the like, is approximately 100 nm or less. Therefore, the size of each of the source/drain regions at both ends of the gate is as small as approximately 200 nm or less. In a case where strain control layers for maintaining a strain are formed in such regions, it is necessary to pay sufficient attention in restraining strain relaxation in the strained semiconductor layer. For example, it is necessary to increase the thickness of each strain control layer while reducing the device size. A typical example of such a structure is shown in FIG. 2. In FIG. 2, the width of the strained semiconductor layer 3 is smaller than that in FIG. 1(b). Accordingly, the widths of the strain control layers 8 to be the source/drain regions also become smaller, and the heights of the strain control layers 8 become greater to maintain the strain. Therefore, inactive regions under the source/drain regions 9 are formed through the same ion implantation as in the case illustrated in FIG. 1(b), the impurities do not reach the strained semiconductor layer 3 and part of the strain control layers 8, because the profile of the ion implantation is the same. As a result, there is a possibility that the resistance in the source/drain cannot be made lower. To avoid such a problem, the depth profile of the impurities to be introduced through ion implantation is made greater in the depth direction. Since the height of the gate electrode 5 is the same as that in the case illustrated in FIG. 1(b), the impurity ions implanted into the gate electrode 5 might reach the channel region, penetrating through the gate electrode 5. This greatly affects the device characteristics, resulting in degradation of the insulating properties of the gate insulating film 4 located immediately below the gate electrode 5 or an increase in gate leakage, degradation in channel characteristics or degradation in mobility, or degradation of the steepness of the transistor characteristics.

In view of the above, the inventors considered that, in the process to form a strained device having a strained channel after strain control layers were formed beforehand on a strained substrate, further strain application by combining two techniques was essential in improving device characteristics. The further strain application could be performed by providing measures against device characteristics degradation derived from the strain control layers due to miniaturization of the device size, and employing the processing strain technique. In other words, the inventors considered that, by adding the strain control layers to a substrate prior to the device production while employing the processing strain technique to form a device having the strain applying effects of the two techniques combined, it would be possible to obtain a semiconductor device and a method of manufacturing the semiconductor device by which strain relaxation can be restrained while a high resistance is avoided in the source/drain regions.

Figure 3:
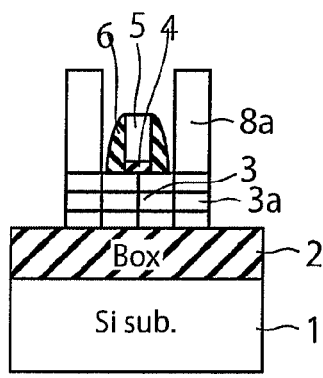
FIG. 3 is a cross-sectional view of a semiconductor device according to an embodiment.

This aspect is now briefly described, with reference to FIG. 3. Through intensified studies, the inventors considered that, instead of the formation of the source/drain regions by impurity ion implantation, silicided strain control layers 8a and a silicided strained semiconductor layer 3a could be formed by performing collective silicidation on the strain control layers 8 and the regions of the strained semiconductor layers 3 located immediately below the strain control layers 8. Through this silicidation, a resistance ten or more times lower than the resistance obtained through impurity ion implantation can be expected even in narrow regions, and the depth restrictions that should be taken into account in the impurity ion implantation are avoided. Accordingly, the restrictions on the thicknesses of the strain control layers are relaxed. In even smaller devices, strain relaxation can be restrained, and a high resistance in the source/drain regions can be avoided. In this manner, a high-performance strained device can be obtained.

In an embodiment, silicidation is simultaneously performed on the strained semiconductor layer 3 made of Si, for example, and the strain control layers 8 made of a material different from the strained semiconductor layer 3, such as SiGe, in the source/drain regions. In this manner, the strained semiconductor layer 3a made of NiSi, for example, and the strain control layers 8a made of NiSiGe, for example, are formed as shown in FIG. 3. Normally, silicidation is performed by causing a reaction between a semiconductor layer and a metal at a high temperature of several hundred degrees centigrade. The inventors paid attention to the simultaneous silicidation of multiple layers. Where stacked layers are simultaneously silicided at a high temperature and are then cooled in a stack structure including different materials, a strain in accordance with the difference in thermal expansion coefficient between two silicide layers formed at the high temperature is induced between the two layers. The inventors discovered that, by controlling the direction of the strain induced due to the thermal expansion coefficient difference between two silicide layers, a desired strain could be applied to the channel region. As a result, while a high resistance in the source/drain regions is avoided, not only the strain in the strained semiconductor layer can be maintained, but also can a further strain be applied.

The following is a detailed description of embodiments, with reference to the accompanying drawings.

First Embodiment

Figure 4A:
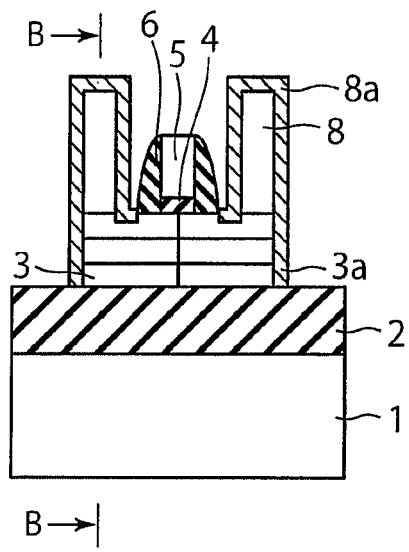
FIG. 4A is a cross-sectional view of a semiconductor device according to a first embodiment.
Figure 4B:
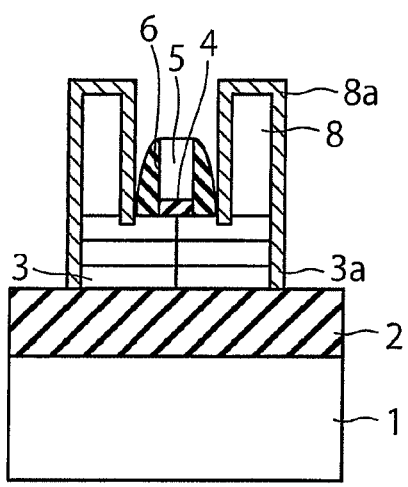
FIG. 4B is a cross-sectional view of a semiconductor device according to a modification of the first embodiment.
Figure 5:
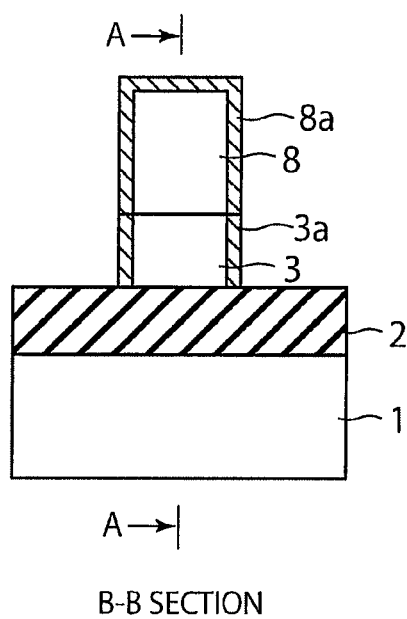
FIG. 5 is a cross-sectional view of the semiconductor device according to the first embodiment.

Referring now to FIGS. 4A through 5, a semiconductor device according to a first embodiment is described. The semiconductor device of the first embodiment is a MOSFET. A cross-section in the gate length direction (Lg direction) of the channel region of the MOSFET is shown in FIG. 4A. A cross-section in the gate width direction (Wg direction) of the source region or the drain region of the MOSFET is shown in FIG. 5. FIG. 4A is a cross-sectional view, taken along the section line A-A of FIG. 5. FIG. 5 is a cross-sectional view, taken along the section line B-B of FIG. 4A.

As shown in FIG. 4A, in the semiconductor device of the first embodiment, a buried oxide layer (BOX layer) 2 is formed on a Si substrate 1, and a strained semiconductor layer (a first semiconductor layer) 3 containing Si is formed in a mesa-like shape on the buried oxide layer 2. The size (the diameter) of the planar shape of the strained semiconductor layer 3 parallel to the upper face of the Si substrate 1, or the maximum distance between two points on the circumference of the planar shape, is 1 µm or smaller. If the planar shape is a rectangular shape, the above size is the length of a diagonal line. If the planar shape is an elliptical shape, the above size is the length of the long axis. A gate insulating film 4 is formed on the strained semiconductor layer 3, and a gate electrode 5 made of a polysilicon, for example, is formed on the gate insulating film 4. Gate sidewalls 6 made of an insulating material are formed on the sides of the gate electrode 5. Si-containing strain control layers (second and third semiconductor layers) 8 that controls the strained semiconductor layer 3 to maintain the strain in the strained semiconductor layer 3 are formed on the portions of the strained semiconductor layer 3 located on both sides of the gate electrode 5. The strain control layers 8 have a different lattice constant from that of the strained semiconductor layer 3. The strain control layers 8 and the portions of the semiconductor layer 3 located immediately below the strain control layers 8 serve as source/drain regions. In the source/drain regions, the respective outer surface regions of the strained semiconductor layer 3 and the strain control layers 8 are silicided, to form a silicided strained semiconductor layer 3a and silicided strain control layers 8a. In this embodiment, a strained Si layer is used as the strained semiconductor layer 3, and strained SiGe layers are used as the strained control layers 8. Ni is used as the metal in the silicidation. Accordingly, the silicided strained semiconductor layer 3a is a NiSi layer, and the silicided strain control layers 8a are NiSiGe layers. In FIG. 4A, there are distances between the gate sidewalls 6 on both sides of the gate electrode 5 and the silicided strain control layers 8a, and a part of the strained semiconductor layer 3 is silicided in between. To further miniaturize the device, the distances need to be made shorter. In that case, the gate sidewalls 6 might be brought into contact with the strained semiconductor layer 3 in a process prior to the silicidation process, as shown in FIG. 4B. In doing so, the silicidation progresses while Ni is diffused into the strained semiconductor layer 3 in contact with the sidewalls 6. The height of the gate sidewalls 6 may be adjusted so that the silicide layers 8a can reach a part of the strained semiconductor layer 3.

In this embodiment, the outer surface regions of the strain control layers 8 and the portions of the strained semiconductor layer 3 located immediately below the strain control layers 8 in the source/drain regions are silicided. The outer surface regions turn into the silicided strain control layers 8a and the silicided strained semiconductor layer 3a, and the inner portions remain the strain control layers 8 and the strained semiconductor layer 3. In a modification of this embodiment, the inner portions may also form the silicided strain control layers 8a and the silicided strained semiconductor layer 3a, as shown in FIG. 3. In this embodiment and the modification, the portion of the strained semiconductor layer 3 that is located immediately below the gate electrode 5 and is to serve as the channel is not silicided.

In the formation of the semiconductor device of this embodiment, a substrate having the strain control layers 8 formed beforehand on the strained semiconductor layer 3 may be used, or the strain control layers 8 may be formed directly on the strained semiconductor layer 3 before the device is manufactured. In a case where the strain control layers 8 are formed over the substrate 1 having the strained semiconductor layer 3 formed thereon, the strain control layers 8 can be formed by a technique such as Molecular Beam Epitaxy (MBE), Chemical Vapor Deposition (CVD), a sputtering method, a liquid phase growth method, or a printing technique. In a case where the strain control layers 8 are formed by CVD, the natural oxide layer on the surface of the strained semiconductor layer 3 is removed beforehand by a diluted HF solution or the like. After that, a gas heated to room temperature, or to a temperature between room temperature and approximately 1000° C., such as a $SiH_4$ gas, a $Si_2H_6$ gas, a dichlorosilane gas, a trichlorosilane gas, a $GeH_4$ gas, or a $Ge_2H_6$ gas, is introduced, to form the strain control layers 8. In this embodiment, for example, the strain in the strained Si layer 3 is a tensile strain of approximately 2%. The Ge composition ratio in the SiGe strain control layers 8 formed on the strained Si layer 3 is 50 atomic %. Therefore, the SiGe strain control layers 8 are formed as relaxed SiGe layers as if having the same lattice constant as that of the lower layer. In this structure, a substrate having the SiGe strain control layers 8 formed on the strained Si layer 3 can be used, as long as the substrate is formed by a bonding method using the upper face, the inner portion, or the lower face of the $SiO_2$ buried oxide layer 2 as a bonding face.

In the above described example, the strained Si layer 3 is to serve as the channel layer. However, in a case where a strained SiGe layer is formed as the strained semiconductor layer, instead of the strained Si layer 3, a SOI substrate including a Si substrate, an insulating layer, and a Si layer is prepared, for example. With the use of a Si raw material gas and a Ge raw material gas, a SiGe layer is typically formed on the SOI substrate heated to 550 degrees centigrade. The growth temperature can be varied from room temperature to 1000° C. Oxidation is then performed in an oxygen atmosphere typically by a Ge condensation method to form a SiGe layer (see T, Tezuka, et al., IEDM Tech. Dig., 946 (2001), for example). In this manner, a SGOI substrate including a Si substrate, an insulating layer, and a strained SiGe layer can be formed. Strained Si layers may be formed as the strain control layers on the strained SiGe layer in the same manner as above.

A thick strain-relaxed SiGe buffer layer may be formed on a bulk Si substrate, instead of a substrate having a SOI structure as described above, and strained Si layers may be formed on the buffer layer. In this manner, the same effects as those of this embodiment can also be achieved.

As shown in FIGS. 4A through 5, silicide layers are formed on the substrate formed as described above. In this embodiment, a Ni layer is formed by a sputtering technique. Other than a sputtering technique, the Ni layer can be formed by Chemical Vapor Deposition (CVD), an epitaxial method, or the like. The thickness of the Ni to be deposited is controlled by adjusting the silicide to be formed. The thickness of the Ni to be deposited is typically in the range of 1 to 100 nm, and is preferably in the range of 5 to 50 nm. After the film formation of the Ni deposition layer, a 350° C. heat treatment is performed in a nitrogen atmosphere, to cause a reaction between Si and Ni. The extra Ni that has not been used in the reaction is then removed with the use of a mixture of a hydrogen peroxide solution and sulfuric acid. Lastly, a 450° C. heat treatment is performed in a nitrogen atmosphere, to form the NiSi layer 3a and the NiSiGe layers 8a, as shown in FIGS. 4A through 5. It should be noted that the silicidation in a nitrogen, argon, hydrogen, or vacuum atmosphere may be performed at 900° C. or lower.

As is apparent from the drawings, the structure formed through the above described procedures is a structure formed by a silicidation process to form a stack structure consisting of the strained semiconductor layer 3 equivalent to the channel and the strain control layers 8 placed on the strained semiconductor layer 3. Therefore, in the silicides formed after the silicidation, the composition ratios correspond to those of the original strained semiconductor layer 3 and the strain control layers 8. As a result, a silicided structure of the stack structure is formed. The inventors paid attention to the silicided structure of the stack structure formed by the silicidation process.

In the following, the strain inducing mechanism formed by the silicidation of the stack structure obtained as above is described by taking a stack structure consisting of the strained Si layer 3 to form a mesa and the strain control layers 8 formed on the strained Si layer 3 as an example.

Figures 6, 7:
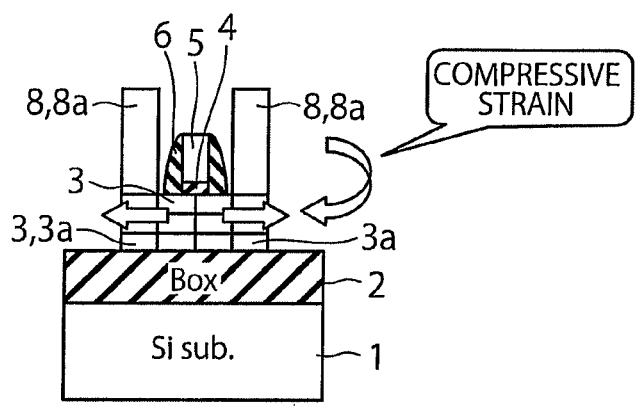
FIG. 6 is a table showing materials that can be used as the strained semiconductor layer and the strain control layers, and the thermal expansion coefficients of the materials.
FIG. 7 is a cross-sectional view for explaining the effects of the semiconductor device according to the first embodiment.

FIG. 6 shows the respective materials and respective thermal expansion coefficients of strained semiconductor layers and strain control layers. It should be noted here that the thermal expansion coefficients vary with materials and composition ratios. The thermal expansion coefficients of NiSi and NiSiGe taken as examples in this embodiment vary with Ge concentrations. Particularly, the thermal expansion coefficient of the NiSiGe with a high Ge concentration is larger than the thermal expansion coefficients of NiSi. The two materials having different thermal expansion coefficients are processed at a high temperature of 500° C. at the same time, for example, and are cooled to room temperature, as described above. In this manner, a strain due to the difference in thermal expansion coefficient can be induced between the two layers. In this embodiment, the thermal expansion coefficient of the NiSiGe layers 8a as the upper layers is larger than that of the NiSi layer 3a as the lower layer, and is made smaller than that of the NiSi layer 3a by cooling. As a result, a compressive strain is applied to the NiSi layer 3a as the lower layer. This situation is illustrated in FIG. 7.

As can be seen from FIG. 6, the thermal expansion coefficient of NiSiGe becomes larger than the thermal expansion coefficient of NiSi, as the Ge concentration becomes higher. This is the physical properties derived from the crystalline structure, and the specific characteristics specific to the elements constituting the material. Accordingly, in this embodiment, the compressive strain to be applied to the NiSi layer can be made larger by using NiSiGe with a high Ge concentration as the strain control layers, and the characteristics of the MOSFET can be improved. Where the Ge concentration is 50 atomic % or higher, an even greater effect can be achieved. This fact was discovered by the inventors for the first time.

As a result, as shown in FIG. 7, a tensile strain from the silicided two-layer structure on either side is applied to the strained semiconductor layer 3 to be the channel sandwiched by the silicided two-layer structures, and an even larger strain than the tensile strain initially induced in the strained semiconductor layer 3 is applied.

In the above explanation, a strained Si layer is used as the strained semiconductor layer 3, and SiGe layers are used as the strain control layers 8. However, in a case where a strained SiGe layer is used as the strained semiconductor layer 3 while strained Si layers are used as the strain control layers 8, a compressive strain is applied to the strained semiconductor layer 3, and, through the silicidation, an even larger compressive strain is applied.

In a case where the strain control layers 8 are made of a material not containing Ge, the thermal expansion coefficients of the strain control layers 8 and the strained semiconductor layer 3 are preferably different from each other by 3% or more.

By introducing the silicidation process into the source/drain regions including the strain control layers 8, the strain induced through the silicidation process because of the silicided two-layer structure is applied selectively to the channel in the middle of the strained semiconductor layer 3. As a result, the strain in the channel becomes larger. That is, a MOSFET having the above described structure can be a high-performance MOSFET that has higher mobility because of the strain increase and the lower resistance in the source/drain regions than that in a MOSFET not having a silicided structure.

In the first embodiment, Si is contained in the strained semiconductor layer 3 and the strain control layers 8. However, the same effects as above can be achieved even where Si is contained in at least either the strained semiconductor layer 3 or the strain control layers 8. In a case where Si is contained in either the strained semiconductor layer 3 or the strain control layers 8, at least the outer surface region of the layer containing Si is silicided. The same applies to the later described second embodiment.

Also, in the semiconductor device of the first embodiment, a Si-based substrate is used. However, the same effects as above can be achieved even where some other substrate is used. For example, it is possible to use a substrate containing at least one element of group-IV elements (C, Si, Ge, Sn, and Pb) and group-III-V elements (B, Al, Ga, In, Ti, N, P, As, Sb, and Bi). That is, it is possible to use a substrate made of BN, SiGe, Ge, SiC, GaAs, GaP, GaN, InN, InP, InGaP, InAs, InGaAl, InGaAlAs, InSb, TiN, or the like, other than Si.

Meanwhile, as the strained semiconductor layer 3 and the strain control layers 8, it is possible to use semiconductors made of one element or a combination of some elements of group-IV elements (C, Si, Ge, In, and Ti) and group-III-V elements (B, Al, Ga, In, Ti, N, P, As, Sb, and Bi). That is, it is preferable to use semiconductor layers made of SiGe, Ge, SiC, GaAs, GaP, GaN, InP, InGaP, InAs, InGaAl, InGaAlAs, InSb, InSe, or the like, other than Si.

As described above, in the first embodiment, the strain control layers for maintaining the largest possible strain in the semiconductor to be the active layer of the device formed on a substrate are formed on the semiconductor layer, so that strain relaxation in the active layer can be restrained, and the strain induced when part of the strain control layers are silicided can be added. Accordingly, the first embodiment can prevent degradation of the device characteristics due to strain relaxation. The first embodiment can also restrain the source/drain regions from having a higher resistance due to miniaturization, and improve the device characteristics by virtue of the selective addition of strain to the channel region of the device.

Manufacturing Method

Figure 8:
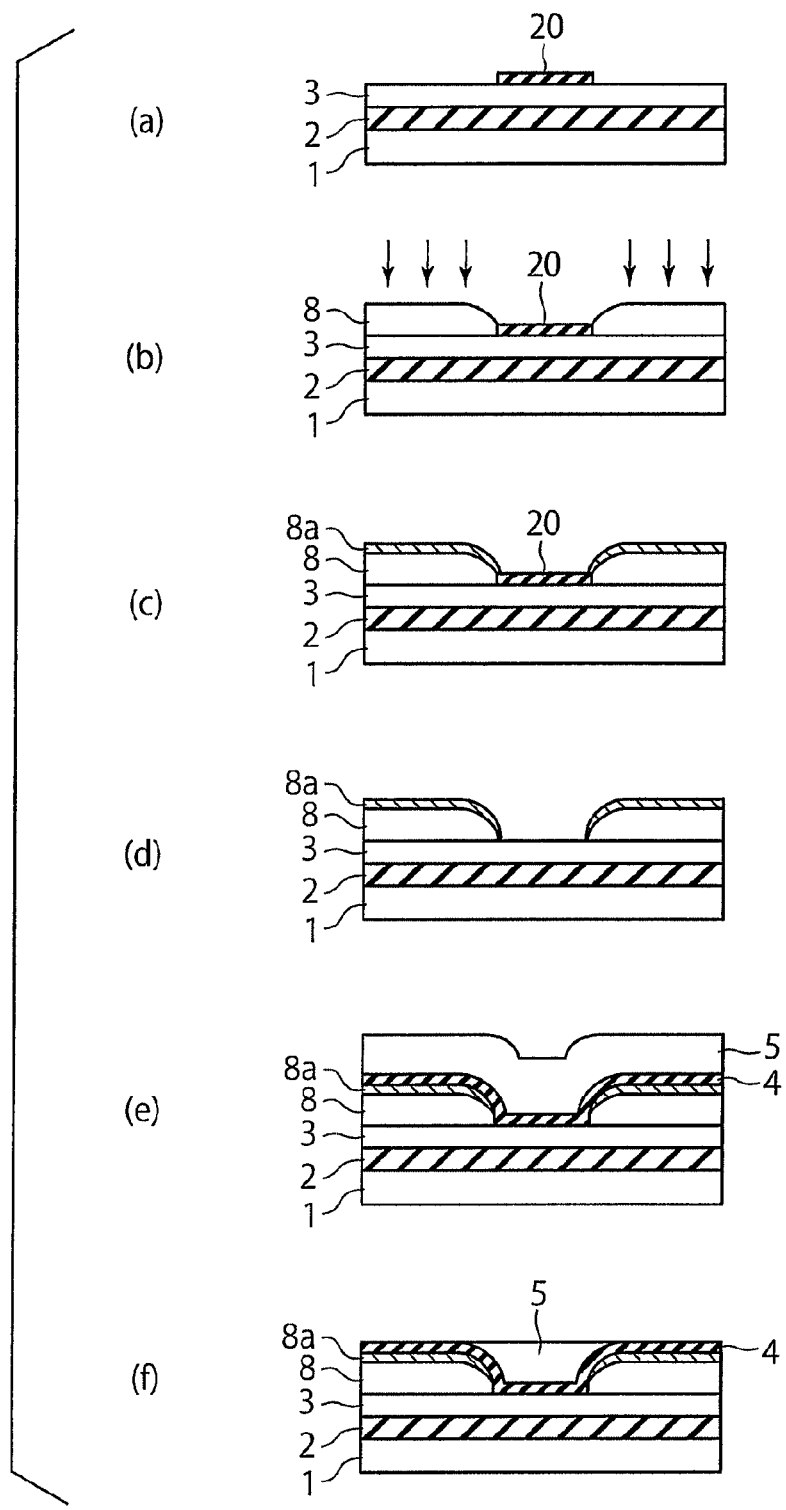
FIGS. 8(a) to 8(f) are cross-sectional views illustrating a specific example of a method of manufacturing the semiconductor device according to the first embodiment.

Referring now to FIGS. 8(*a*) through 8(*e*), a specific example of a method of manufacturing the semiconductor device according to the first embodiment is described.

In general, after a gate structure is formed, a heating process such as silicidation is normally performed. However, in a case where a high-dielectric-constant thin film is used as the gate insulating film or where an extremely thin gate insulating film is used, the gate insulating film is significantly degraded due to activation of the source/drain through a high-temperature treatment. Therefore, a dummy gate is first formed in the gate portion.

First, the Si substrate 1 having the buried oxide layer 2 formed on the upper face thereof is prepared. The Si layer 3 is formed as the strained semiconductor layer on the buried oxide layer 2. A dummy gate 20 made of an insulating material is then formed on the Si layer 3 (FIG. 8(*a*)).

Next, as shown in FIG. 8(*b*), the SiGe layers 8 are selectively grown as the strain control layers on the Si layer 3. In the growth of the SiGe layers 8, the SiGe layers 8 are preferably not formed on the dummy gate 20 under processing conditions in reality, and therefore, it is preferable to use CVD. However, instead of CVD, a process that can remove the dummy gate 20 in a later stage may be used, and, in such a case, the SiGe layers 8 may be grown on the dummy gate 20. In a case where the SiGe layers 8 are grown by CVD, for example, the natural oxide layer on the surface of the strained semiconductor layer 3 is removed with a diluted HF solution or the like in advance. After that, a gas such as a $SiH_4$ gas, a $Si_2H_6$ gas, a dichlorosilane gas, a trichlorosilane gas, a $GeH_4$ gas, or a $Ge_2H_6$ gas heated to room temperature or to a temperature between room temperature and approximately 1000° C. is introduced into the surface, to grow SiGe. As the SiGe layers 8 are grown on the Si layer 3, and the SiGe layers 8 is grown as the strained SiGe layers 8, because of the difference in lattice constant. After the SiGe layers 8 are grown, impurity ion implantation into the SiGe layers 8 is performed, to form impurity layers to be the source/drain regions. At this point, impurities may be implanted into the portions of the Si layer 3 located immediately below the SiGe layers 8. After the ion implantation, annealing is performed to activate the impurity layers. To restrain a short channel effect, Lightly Doped Drain (LDD) structures, Extension structures, or HALO structures may be used as the impurity layers. After the SiGe layers 8 are grown, patterning is performed on the SiGe layers 8 and the Si layer 3 before or after the ion implantation. In this manner, the shape of a MOSFET is formed (not shown). Through the patterning, the Si layer 3 and the SiGe layers 8 have mesa-like shapes.

Ni is then deposited on the entire surface, to cover the outer surface regions of the SiGe layers 8 and the exposed outer surface region of the Si layer 3 with the Ni. In the Ni deposition, a sputtering technique is normally used, but CVD or a solution-growth technique may be used, instead. After that, a heat treatment for silicidation is performed in a nitrogen atmosphere. The silicidation process may be performed in vacuum, the atmosphere, argon atmosphere, nitrogen atmosphere, or a hydrogen atmosphere, instead of a nitrogen atmosphere. The heat treatment is performed at a temperature between 200° C. and 900° C. Since the crystalline phases of silicides vary with temperature, the heat treatment temperature needs to be selected in accordance with the characteristics of the semiconductor device. At a low temperature, the heat treatment is preferably performed at a temperature between 350° C. and 500° C. Through this heat treatment, the Si in the outer surface regions of the SiGe layers 8 and the exposed outer surface region of the Si layer 3 reacts with the Ni. As a result, the SiGeNi layers 8*a* are formed in the outer surface regions of the SiGe layers 8, and the NiSi layer (not shown) is formed in the exposed outer surface region of the Si layer 3. The extra Ni that has not been used in the reaction is then removed with the use of a mixture of a hydrogen peroxide solution and sulfuric acid. After that, a heat treatment is performed in a nitrogen atmosphere, to form the NiSi layer (not shown) and the NiSiGe layers 8*a*, as described above.

Next, as shown in FIG. 8(*d*), the dummy gate 20 is removed. The gate insulating film 4 is then formed in the region from which the dummy gate 20 has been removed. The gate electrode 5 is formed on the gate insulating film 4 (FIG. 8(*e*)). Finally, as shown in FIG. 8(*f*), part of the gate electrode 5 is removed by the CMP process. The CMP process can be carried out to remove the entire gate electrode 5 just on the source and drain area. The CMP will also remove the part of the gate insulating film 4 or the silicide 8.

By this manufacturing method, the silicide formation is performed at a relatively low temperature (450° C. or lower, for example). Therefore, silicidation may be performed after the formation of the gate structure.

Also, by the above described manufacturing method, the respective outer surfaces of the strained semiconductor layer 3 and the strain control layers 8 are silicided. In a case where Si is contained in either the strained semiconductor layer 3 or the strain control layer 8, however, at least the outer surface region of the layer containing Si is silicided. This also applies to the later described method of manufacturing a semiconductor device of a second embodiment.

Second Embodiment

Figure 9:
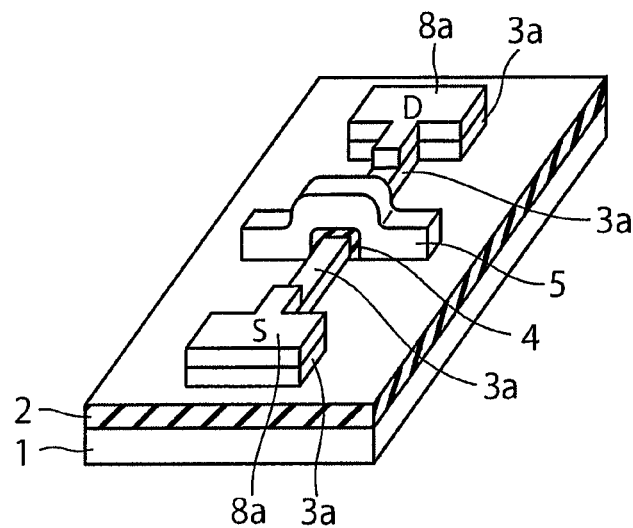
FIG. 9 is a perspective view of a semiconductor device according to a second embodiment.

Referring now to FIG. 9, a semiconductor device according to the second embodiment is described. The semiconductor device of this embodiment is a MOSFET. FIG. 9 is a perspective view of the MOSFET.

This MOSFET is formed on a Si substrate 1 having a buried oxide layer 2 formed on the upper face thereof. A strained semiconductor layer 3a that is to be the channel and the source/drain regions and has a surface region silicided is formed in a mesa-like shape. The size (the diameter) of the planar shape of the strained semiconductor layer 3a parallel to the upper face of the Si substrate 1 is 1 μm or less. The semiconductor layer 3a includes a long and thin channel, and source/drain regions that are connected to both sides of the channel and have larger planar shapes parallel to the upper face of the buried oxide layer 2 than the planar shape of the channel. Strain control layers 8a having the surface regions silicided are formed on the source/drain regions. That is, the source/drain regions each have a stack structure consisting of the strained semiconductor layer 3a and one of the strain control layers 8a. In a region of the channel between the source region S and the drain region D, a gate insulating film 4 is formed to cover the channel, and a gate electrode 5 is formed on the gate insulating film 4. The gate electrode 5 extends in a direction substantially perpendicular to the direction from the source region S to the drain region D. In this embodiment, the silicided strained semiconductor layer 3a is a strained NiSi layer, and the strain control layers 8a are NiSiGe layers. It should be noted that the Ge concentration in the NiSiGe layers is preferably 50 atomic % or higher.

In the MOSFET of the second embodiment having the above described structure, the silicided strain control layers 8a are formed on the silicided strained Si layer 3a in the source region S and the drain region D, so as to maintain the strain in the strained Si layer 3a even though the MOSFET is miniaturized. Accordingly, strain relaxation in the region to be the channel can be restrained. Further, the strain induced when the strain control layers are silicided can be added. Accordingly, this embodiment can prevent degradation of the device characteristics due to strain relaxation. This embodiment can also restrain the source/drain regions from having a higher resistance due to miniaturization, and improve the device characteristics by virtue of the selective addition of strain to the channel region of the device.

First Specific Example of the Manufacturing Method

Referring now to FIGS. 10 through 18(b), a first specific example of a method of manufacturing the semiconductor device according to the second embodiment is described.

Figure 10:
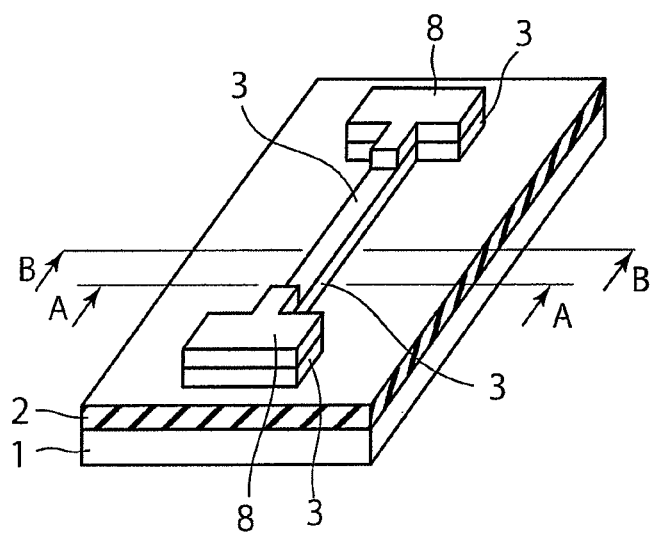
FIG. 10 is a perspective view illustrating a method of manufacturing the semiconductor device according to the second embodiment.
Figure 11:
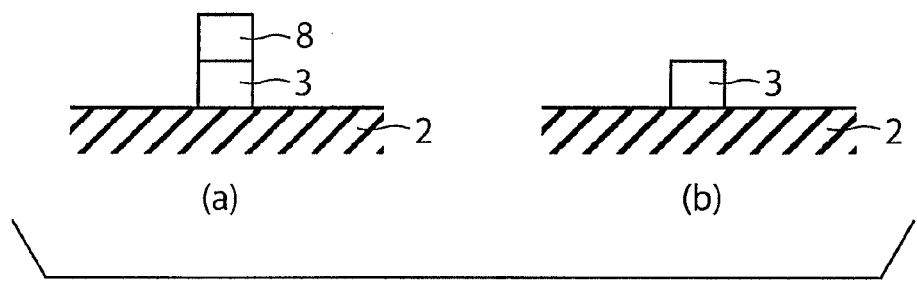
FIGS. 11(a) and 11(b) are cross-sectional views illustrating the method of manufacturing the semiconductor device according to the second embodiment.
Figure 12:
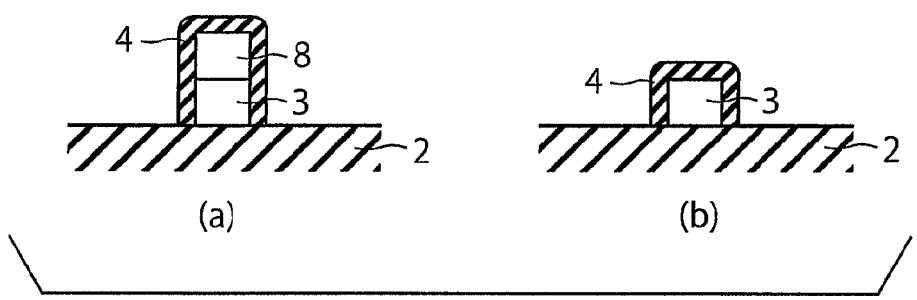
FIGS. 12(a) and 12(b) are cross-sectional views illustrating the method of manufacturing the semiconductor device according to the second embodiment.
Figure 13:
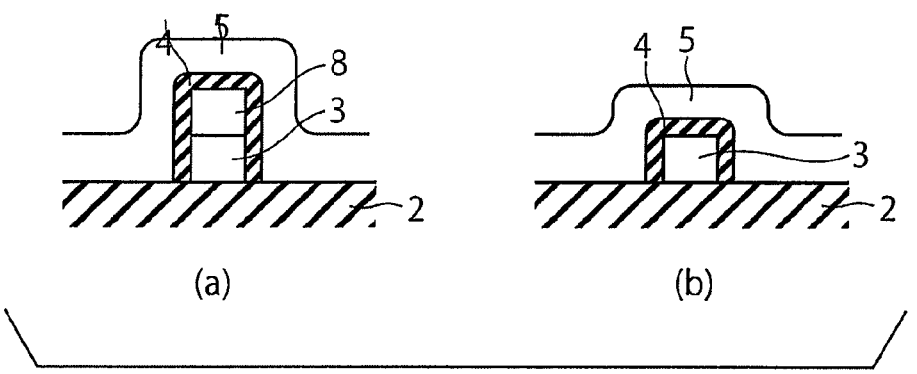
FIGS. 13(a) and 13(b) are cross-sectional views illustrating the method of manufacturing the semiconductor device according to the second embodiment.
Figure 14:
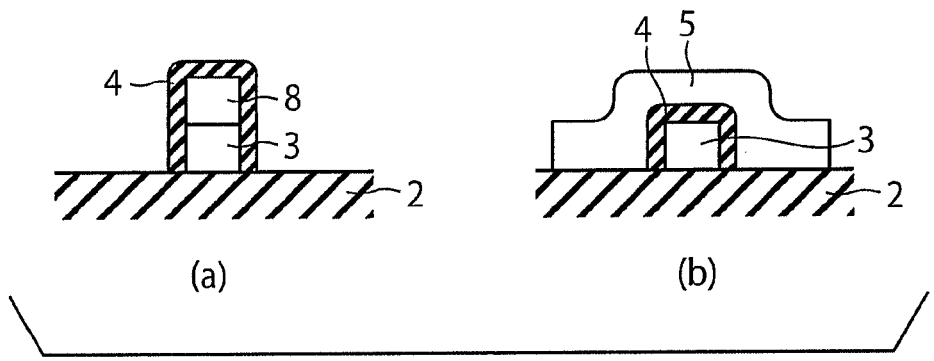
FIGS. 14(a) and 14(b) are cross-sectional views illustrating the method of manufacturing the semiconductor device according to the second embodiment.

First, as shown in FIG. 10, a substrate having the buried oxide layer 2 made of $SiO_2$ formed on the Si substrate 1 is prepared. A stack film consisting of a Si layer 3 and a SiGe layer 8 placed on the Si layer 3 is formed on the buried oxide layer 2. The Si layer 3 and the SiGe layer 8 are formed by the technique described in the first embodiment and the modification of the first embodiment is used. As the stack film is formed, the Si layer 3 turns into a strained Si layer (the strained semiconductor layer) 3, and the SiGe layer 8 turns into a strained SiGe layer (the strain control layer) 8. To form the shape of a MOSFET, patterning is then performed on the SiGe layer 8 and the Si layer 3 by Reactive Ion Etching (RIE). Through the patterning, the Si layer 3 has a mesa-like shape. After that, the portion of the SiGe layer 8 located on the portion of the Si layer 3 to be the channel region is removed. That is, the SiGe layers 8 remain on the portions of the Si layer 3 to be the source/drain regions. FIG. 11(a) is an A-A cross-sectional view of the semiconductor device in this stage, taken along the section line A-A of FIG. 10. FIG. 11(b) is a B-B cross-sectional view of the semiconductor device in this stage, taken along the section line B-B of FIG. 10. That is, the A-A cross-section is a cross-section of the source region, and the B-B cross-section is a cross-section of the channel region.

Next, as shown in FIGS. 12(a) and 12(b), the gate insulating film 4 is formed to cover the channel region and the source/drain regions. As the gate insulating film 4, a $SiO_2$ film, a nitride film (such as a SiN film or a SiON film), or a high-dielectric-constant insulating film (such as a $HfO_2$ film, a HfON film, a $LaO_2$ film, a $GeO_2$ film, a $SrO_2$ film, a $ZrO_2$, film, a NO film, or a $NO_2$ film) is used. Alternatively, an oxide film containing at least one element selected from Si, N, Ge, Hf, Zr, La, Pr, Ti, and Al can be used. Normally, the gate insulating film 4 is designed to be approximately 10 nm or less in physical film thickness. A gate electrode material film 5 is then formed to cover the gate insulating film 4 (FIGS. 13(a) and 13(b)). As the gate electrode material film 5, a polysilicon film having impurities added thereto, an amorphous silicon film, an amorphous silicon film having impurities added thereto, or a metal film (such as a TiN film, an Al film, a Cu film, an Au film, a TaN film) can be used, and the film thickness of the gate electrode material film 5 is normally between 10 nm and 100 nm. FIGS. 12(a) and 13(a) are cross-sectional views corresponding to the A-A cross-sectional view taken along the section line A-A of FIG. 10, and FIGS. 12(b) and 13(b) are cross-sectional views corresponding to the B-B cross-sectional view taken along the section line B-B.

Figure 15:
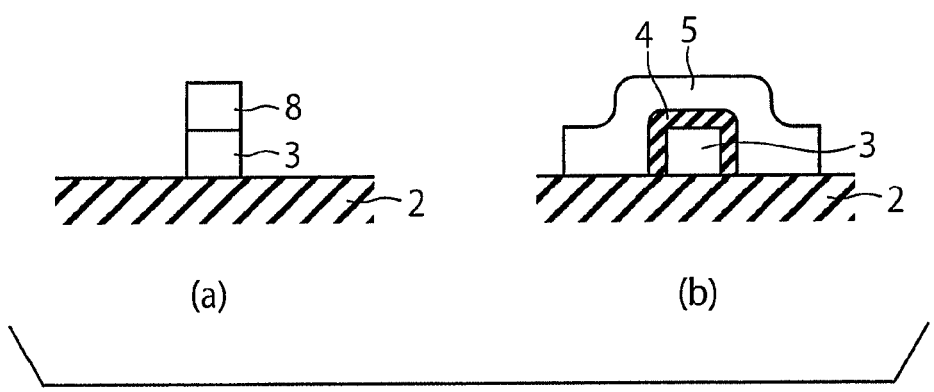
FIGS. 15(a) and 15(b) are cross-sectional views illustrating the method of manufacturing the semiconductor device according to the second embodiment.
Figure 16:
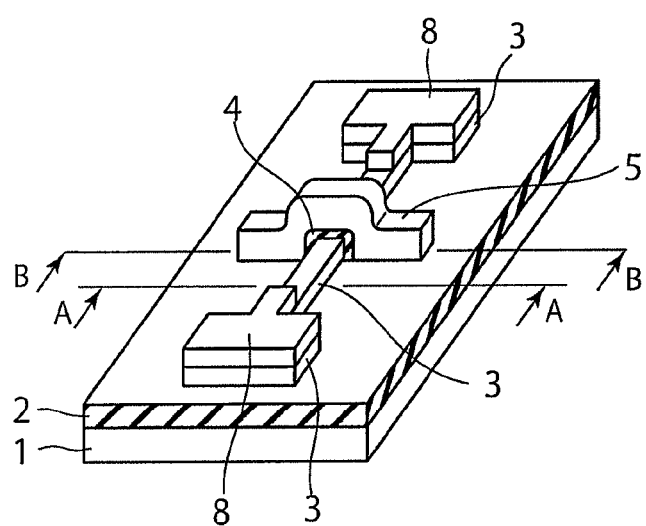
FIG. 16 is a perspective view illustrating a method of manufacturing the semiconductor device according to the second embodiment.
Figure 17:
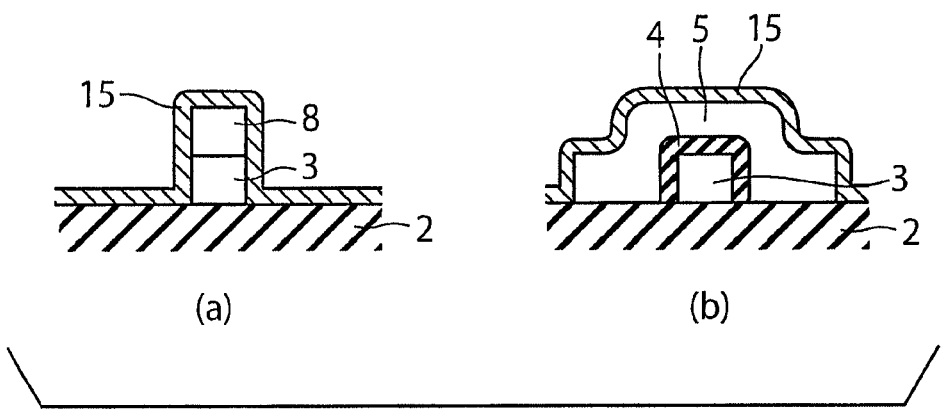
FIGS. 17(a) and 17(b) are cross-sectional views illustrating the method of manufacturing the semiconductor device according to the second embodiment.
Figure 18:
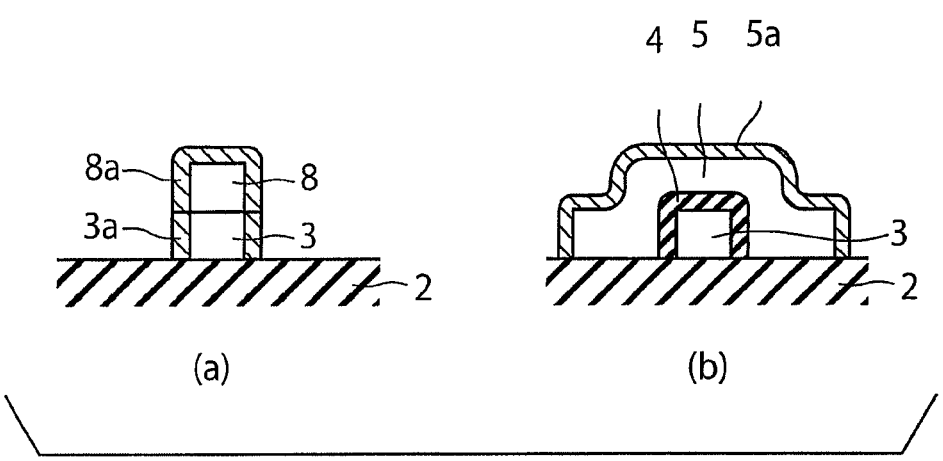
FIGS. 18(a) and 18(b) are cross-sectional views illustrating the method of manufacturing the semiconductor device according to the second embodiment.

Patterning is then performed on the gate electrode material film 5 to have the shape of a gate electrode. In this manner, the gate electrode 5 is formed. At this point, the gate electrode 5 is patterned to cover a part of the channel region (FIGS. 14(a) and 14(b)). After that, the portions of the gate insulating film 4 located on the channel region and the source/drain regions not covered with the gate electrode 5 are removed (FIGS. 15(a) and 15(b)). FIG. 16 is a cross-sectional view of the semiconductor device in this stage. It should be noted that FIG. 15 (a) shows the A-A cross-section taken along the section line A-A of FIG. 16, and FIG. 15(b) shows the B-B cross-section taken along the section line B-B. The portion of the channel region not covered with the gate electrode 5 is then covered with a mask, and impurity ions are implanted into the regions to be the source/drain, to form impurity layers. After that, annealing is performed to activate the impurity layers. In this manner, the source/drain regions are formed. Since the strained Si layer 3 and the strain control layers 8 are thin films, impurity ions may be first implanted into the strain control layers 8. Impurity ions may be introduced into the strained Si layer 3 through diffusions in the high-temperature treatment for activating the impurity layers in a later stage.

Next, an Ni film 15 is deposited on the entire surface (FIGS. 17(a) and 17(b)). In the deposition of the Ni film 15, a sputtering technique is normally used, but CVD or a solution-growth technique may be used, instead. After that, a heat treatment for silicidation is performed in a nitrogen atmosphere. The silicidation process may be performed in vacuum, the atmosphere, or a hydrogen atmosphere, instead of a nitrogen atmosphere. The heat treatment is performed at a temperature between 200° C. and 900° C. Since the crystalline phases of silicides vary with temperature, the heat treatment temperature needs to be selected in accordance with the characteristics of the device. At a low temperature, the heat treatment is preferably performed at a temperature between 350° C. and 500° C. Through this heat treatment, the Si in the outer surface regions of the SiGe layers 8 and the exposed outer surface region of the Si layer 3 reacts with the Ni. As a result, the SiGeNi layers 8a are formed in the outer surface regions of the SiGe layers 8, and the NiSi layer 3a are formed in the exposed outer surface region of the Si layer 3. The extra Ni that has not been used in the reaction is then removed with the use of a mixture of a hydrogen peroxide solution and sulfuric acid. After that, a heat treatment is performed in a nitrogen atmosphere, to form the NiSi layer 3a and the NiSiGe layers 8a (FIGS. 18(a) and 18(b)), as described above. The semiconductor device in this stage is shown in the perspective view of FIG. 9. In a case where the gate electrode 5 is a semiconductor layer containing Si, a silicide layer 5a is formed on the surface of the gate electrode 5, as shown in FIG. 18(b). As the surfaces of the source/drain regions are silicided in particular, low-resistance contact layers can be obtained. FIGS. 17(a) and 18(a) are cross-sectional views corresponding to the A-A cross-sectional view taken along the section line A-A of FIG. 16, and FIGS. 17(b) and 18(b) are cross-sectional views corresponding to the B-B cross-sectional view taken along the section line B-B.

Next, an interlayer insulating film is deposited, to cover the gate electrode 5 and source/drain regions. An opening that leads to the gate electrode 5 and the source/drain regions is formed in the interlayer insulating film, and the opening is filled with a metal, to form an extraction metal electrode. In this manner, the MOSFET is completed.

The MOSFET manufactured by the first specific example of the manufacturing method can achieve the same effects as those achieved by the second embodiment.

Second Specific Example of the Manufacturing Method

A second specific example of the method of manufacturing the semiconductor device according to the second embodiment is now described. The second specific example of the manufacturing method differs from the first specific example of the manufacturing method in the following aspects.

In the second specific example, before a SiGe layer 8 is formed on a strained Si layer 3, a protection oxide film is formed on the region of the strained Si layer 3 on which the gate is to be formed. The SiGe layer 8 is then formed in the source/drain regions. After that, the protection oxide film is removed. In this aspect, the second specific example differs from the first specific example.

Specifically, a substrate having the strained Si layer 3 formed thereon is formed on a Si substrate 1 having a buried oxide layer 2 formed thereon. A protection oxide film made of SiO$_2$ is selectively formed on the region of the strained Si layer 3 on which the gate is to be formed. The strained SiGe layer 8 is then formed on the regions to be the source/drain.

Next, patterning is then performed on the strained SiGe layer 8 and the strained Si layer 3 with the use of a mask (not shown), to form a stack structure consisting of the strained Si layer 3 and the strained SiGe layers (the strain control layers) 8. After that, the protection oxide film is removed. At this point, the strain control layers 8 remain in the regions of the active layer to be the source/drain.

The gate insulating film is then formed in the region that has the protection oxide film removed therefrom and is to be the channel, and the gate electrode is formed on the gate insulating film. The procedures to be carried out thereafter are the same as those of the first specific example.

The MOSFET manufactured by the second specific example of the manufacturing method can also achieve the same effects as those achieved by the second embodiment. That is, the second specific example of the manufacturing method is the same manufacturing method as the manufacturing method of the first embodiment illustrated in FIGS. 8(a) through 8(e).

Furthermore, in the second specific example, the protection oxide film is formed on the region of the strained Si layer 3 on which the gate is to be formed, and the strain control layer 8 is then formed. Accordingly, the probability that the surface of the strained Si layer 3 to be the channel is damaged and the transistor characteristics are degraded at the time of the patterning of the strain control layers 8 can be lowered by forming the protection oxide film. That is, in the patterning of the strain control layers 8, overetching, or removal of the channel surface, is inevitable to completely expose the channel surface. To minimize the overetching, an etching control operation needs to be performed on the order of atomic size. For example, in a case where RIE is used to perform etching on Si, the etching rate is several nanometers per second, and overetching on the channel surface cannot be avoided in reality. As a result, in addition to the above described damage to the channel, possible causes of device defects occur, such as field concentrations at the end portions or a denaturalization in the gate insulating film. Therefore, it is useful to form the protection oxide film to restrain occurrence of the causes of device defects as in the second specific example of the manufacturing method.

It should be noted that, in the second specific example, the above described protection oxide film formed on the channel surface has such a film thickness that the protection oxide film can be removed by vapor or liquid phase etching by the time when the gate stack structure (the stack structure consisting of the gate insulating film and the gate electrode) is formed, and the preferable thickness is typically from 1 to 50 nm. In the second specific example of the manufacturing method, a SiO$_2$ film is used as the protection oxide film. However, any other film can be actually used, as long as the film can be removed prior to the formation of the gate stack structure and can restrain damage to the surface of the strained Si layer 3 to be the channel surface.

As described so far, according to each of the above embodiments, strain relaxation in the channel can be restrained, even though the device is miniaturized. Accordingly, a high-performance semiconductor device can be realized. Also, a stack structure consisting of silicide layers made of different materials are formed in the source/drain regions in the semiconductor device. Accordingly, a high resistance can be avoided, and, at the same time, additional application of a local strain can be performed.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A semiconductor device comprising:
    a substrate;
    a first semiconductor layer provided on the substrate and having a strain, the first semiconductor layer being a single layer;
    second and third semiconductor layers provided at a distance from each other on the first semiconductor layer, and having a different lattice constant from a lattice constant of the first semiconductor layer;
    a gate insulating film provided on a first portion of the first semiconductor layer, the first portion being located between the second semiconductor layer and the third semiconductor layer and including a channel; and
    a gate electrode provided on the gate insulating film, wherein:
the first semiconductor layer is a Si layer and the second and third semiconductor layers are SiGe layers, or the first semiconductor layer is a SiGe layer and the second and third semiconductor layers are Si layers,
an outer surface region of the second semiconductor layer and a side face region of a second portion of the first semiconductor layer are first silicide regions, the second portion of the first semiconductor layer being located immediately below the second semiconductor layer, and the side face region of the second portion being of the first semiconductor layer a different region from an upper surface of the second portion of the first semiconductor layer,
an outer surface region of the third semiconductor layer and a side face region of a third portion of the first semiconductor layer are second silicide regions, the third portion of the first semiconductor layer being located immediately below the third semiconductor layer, and the side face region of the third portion being of the first semiconductor layer a different region from an upper surface of the third portion of the first semiconductor layer, and a silicide region that contains Ge and is included in the first and second silicide regions has a Ge concentration of 50 atomic % or higher.

2. The device according to claim 1, wherein the first semiconductor layer is provided in a mesa-like shape on the substrate.

3. The device according to claim 1, wherein the second and third semiconductor layers have a thermal expansion coefficient larger than a thermal expansion coefficient of the first semiconductor layer by 3% or more.

4. The device according to claim 1, wherein the first semiconductor layer is a strained Si layer, and the second and third semiconductor layers are SiGe layers.

5. The device according to claim 1, wherein a size of the first semiconductor layer is 1 μm or smaller and the size of the first semiconductor layer being a maximum distance between two points on a circumference of the first semiconductor layer.

6. The device according to claim 1, wherein an insulating layer is provided between the first semiconductor layer and the substrate.

* * * * *